United States Patent
Hu et al.

(10) Patent No.: US 8,331,095 B2
(45) Date of Patent: Dec. 11, 2012

(54) STORAGE

(75) Inventors: Yong-Liang Hu, Shanghai (CN); Yang Zhang, Shanghai (CN); Shi-Feng Wang, Shanghai (CN); Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 316 days.

(21) Appl. No.: 12/702,296

(22) Filed: Feb. 9, 2010

(65) Prior Publication Data

US 2011/0194242 A1 Aug. 11, 2011

(51) Int. Cl.
*H05K 7/16* (2006.01)
*H05K 5/00* (2006.01)
*A47B 81/00* (2006.01)

(52) U.S. Cl. .................. 361/727; 361/724; 361/679.33; 312/223.1; 312/223.2

(58) Field of Classification Search .......... 361/724–727, 361/679.01–679.45, 679.55–679.59; 312/223.1, 312/223.2
See application file for complete search history.

(56) References Cited

U.S. PATENT DOCUMENTS

| | | | |
|---|---|---|---|
| 6,754,082 B1 * | 6/2004 | Ding et al. | 361/727 |
| 6,906,918 B2 * | 6/2005 | Rabinovitz | 361/679.48 |
| 7,359,186 B2 * | 4/2008 | Honda et al. | 361/679.33 |
| 2003/0039099 A1 * | 2/2003 | Chen | 361/727 |
| 2003/0048613 A1 * | 3/2003 | Garnett et al. | 361/724 |
| 2006/0041783 A1 * | 2/2006 | Rabinovitz | 714/6 |
| 2008/0239657 A1 * | 10/2008 | Oyama et al. | 361/685 |

FOREIGN PATENT DOCUMENTS

CN 1747054 A 3/2006

* cited by examiner

*Primary Examiner* — Jayprakash N Gandhi
*Assistant Examiner* — Nidhi Desai
(74) *Attorney, Agent, or Firm* — CKC & Partners Co., Ltd.

(57) ABSTRACT

A storage server includes a case, an adapter board, a control board module, a power supply module, a plurality of hard disk units, a plurality of dividing boards, and a case cover. The adapter board divides the case into a first space and a second space. The control board module and the power supply module are disposed in the first space and electrically connected to the adapter board. The hard disk units are disposed in the second space, and the hard disk backboards thereof are connected to the adapter board via cables. The dividing boards are used to separate the hard disk units. The second space and the hard disk units disposed therein are covered with the case cover.

14 Claims, 6 Drawing Sheets

STORAGE

BACKGROUND

1. Field of Invention

The present invention relates to a data storing apparatus. More particularly, the present invention relates to a storage using multiple hard disk modules.

2. Description of Related Art

As the network advances continuously, the server of the network device must have higher performance. Depending on more abundant network resources, the storage specifically for storing data is required higher. The storage is an apparatus specifically for storing the network data, and it is usually applied with the server together because the storage and the server are necessarily configured together on a rack. The storage, which has a very similar appearance to the server, includes a case and a front panel on a front end thereof. When the case is assembled on the rack, the front panel is exposed on the front end for providing a user to operate. Hard disks are the most important components of the storage. Storing capacity of the storage, which is defined as the numbers of the hard disks inserted into the storage, is the most important indicator of the storage in technology. In general, the hard disks of the storage are hot-plug, and the hot-plug interfaces of hard disks are disposed on the front panel for convenient operation. However, the numbers of the hard disks are limited due to the narrow space of the front panel.

With respect to the storage, there is a need of a storage with large capacity, which can receive more hard disks, as well as reasonable and convenient configuration of respective components.

SUMMARY

Accordingly, an aspect of the present invention is to provide a storage for configuring more hard disks therein.

Another aspect of the present invention is to provide a storage having redundant mechanism.

A further aspect of the present invention is to provide a storage for configuring the respective components.

According to an embodiment, the present invention discloses a storage, which includes a case, an adapter board, a control board module, a power supply module, a plurality of hard disk units, a plurality of dividing boards, and a case cover. The case has a bottom plate and two parallel side plates. The adapter board is disposed between and vertical to the side plates, so as to divide the case into a first space and a second space. The control board module is disposed in the first space and electrically connected to the adapter board. The power supply module is disposed in the first space and electrically connected to the adapter board. The hard disk units is disposed in the second space, and each of the hard disk units includes a hard disk back board disposed on the bottom plate, a plurality of hard discs vertically inserted into an upper surface of the hard disk back board, and a cable set connecting between the hard disk back board and the adapter board. The dividing boards are disposed between the side plates, so as to separate the hard disk units. The second space and the hard disk units disposed therein are covered with the case cover.

The dividing boards are substantially vertical to the side plates. The control board module comprises a first control board and a second control board redundantly with each other. The first control board and the second control board are slidely disposed in the first space, parallel to the bottom plate and vertically connected to the adapter board. Each of the hard disk array units comprises a hard disk expansion card module, in which the hard disk expansion card module is inserted vertically into the upper surface of the corresponding hard disk back board, so as to expand a hard disk interface of the hard disk backboard. Each of the hard disk expansion card module comprises a first hard disk expansion card and a second hard disk expansion card redundantly with each other, the first control board controls the first hard disk expansion card, and the second control board controls the second hard disk expansion card. The hard disk expansion card module is disposed on a side of the cable set. The storage further comprises a fan module that is slidely disposed in the first space, parallel to the bottom plate and vertically connected to the adapter board. The power supply module comprises a first power supply and a second power supply redundantly with each other, in which the first power supply and the second power supply are slidely disposed in the first space, parallel to the bottom plate and vertically connected to the adapter board. Each of the dividing boards has a guiding pore disposed therein, and the cable set of each of the hard disk units passes through the guiding pore for connecting the adapter board with the corresponding hard disk back board. The storage further comprises a strengthening beam, in which the strengthening beam is disposed parallel to the side plates and lodged in each notch above each guiding pore of each of the dividing boards. The strengthening beam has the same distance substantially apart from the two side plates. Each folded edge on two sides of the notch of each of the dividing boards has a protrusion disposed thereon, and a plurality of trenches of the strengthening beam have openings toward the bottom plate and lodged in the corresponding protrusions. The storage further comprises a front panel, a switch circuit board and a power controlling wire, in which the front panel is disposed on a front end of the second space, the switch circuit board is disposed in an inner side of the front panel, and a power controlling wire passes through the guiding pores of the dividing boards and electrically connects between the switch circuit board and the adapter board. A plurality of guiding tracks are formed between the adjacent two dividing boards and vertical to the bottom plate, and the hard disks are inserted among the guiding tracks.

The storage can use the hard disk expansion card module to expand the quantity of the hard disk interfaces controlled by the control board module as possible. In addition, the components like the hard disk expansion card module, the power supply module and the control board module all have the redundant scheme, thereby keeping the storage to operate normally even when any one of the aforementioned components is destroyed.

BRIEF DESCRIPTION OF THE DRAWINGS

The invention can be more fully understood by reading the following detailed description of the embodiment, with reference made to the accompanying drawings as follows:

FIGS. 1A and 18 depict an explored diagram and a stereo diagram of a storage according to a first embodiment of the present invention, respectively;

DETAILED DESCRIPTION

In view of the below disclosure and drawings, it is intended that the present invention covers modifications and variations of this invention provided they fall within the scope of the following claims. The skilled artisan in the art can readily understand the invention by reading the detailed description of the embodiment in the below, with reference made to the accompanying drawings as follows. In view of the following, it is intended that the present invention cover modifications and variations of this invention provided they fall within the scope of the following claims.

Figure 1A:
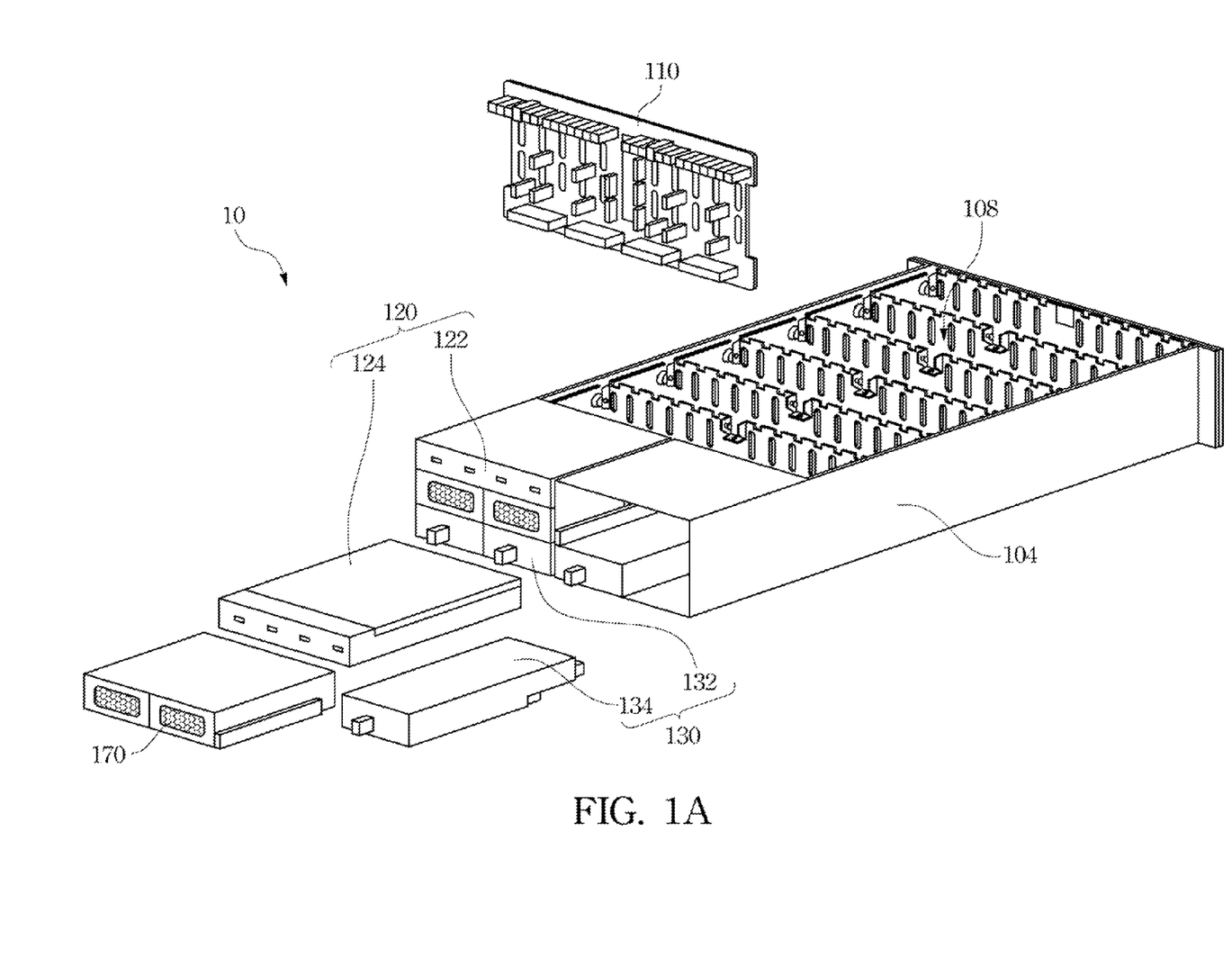
Figure 1B:
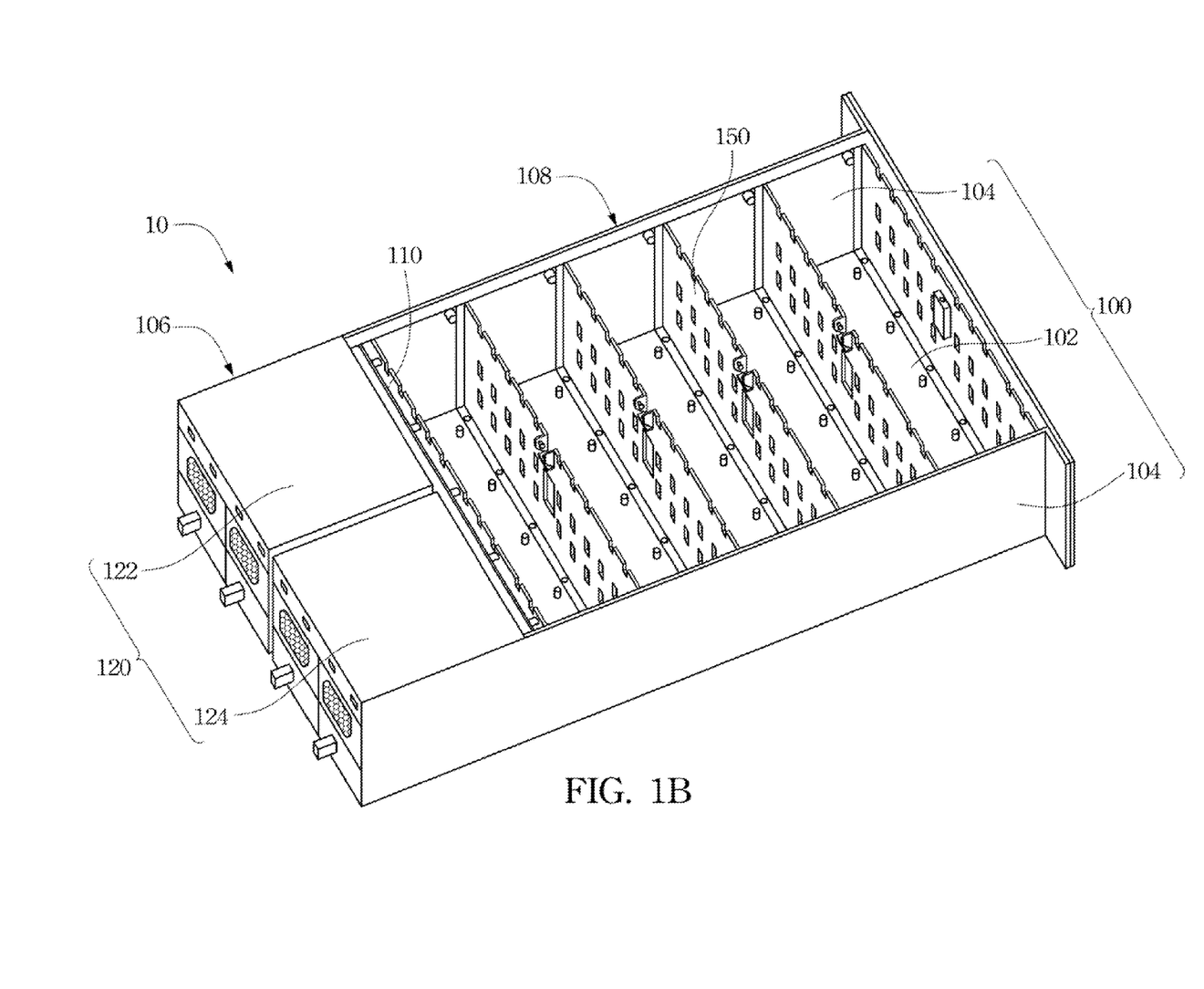

Reference is made to FIGS. 1A and 1B, which depict an explored diagram and a stereo diagram of a storage 10 according to a first embodiment of the present invention, respectively. The storage 10 includes a case 100, an adapter board 110, a control board module 120, a power supply module 130, and a plurality of dividing boards 150. The case 100 includes a bottom plate 102 and two parallel side plates 104, and the side plates 104 are vertically disposed on two opposite edges of the bottom plate 102, respectively. The adapter board 110 is disposed between and vertical to the side plates 104, so as to divide the case 100 into a first space 106 and a second space 108, resulting in the first space 106 and the second space 108 disposed on two opposite sides of the adapter board 110. Two sliding tracks (not shown) can be disposed on external sides of the two side plates 104, respectively, for assembling the storage 10 onto a rack, in which the first space 106 is located in a back side of the rack, and the second space 108 is located in a front side of the rack. The control board module 120 is disposed in the first space 106 and electrically connected to the adapter board 110. The control board module 120 comprises a first control board 122 and a second control board 124 redundantly with each other. The first control board 122 and the second control board 124 are slidely disposed in the first space 106, parallel to the bottom plate 102 and vertically connected to the adapter board 110. When the storage 10 is assembled on the rack, the first control board 122 or the second control board 124 can be hot-plugged from the back side of the rack.

The power supply module 130 is disposed in the first space 106 and electrically connected with the adapter board 110. The power supply module 130 comprises a first power supply 132 and a second power supply 134 redundantly with each other, in which the first power supply 132 and the second power supply 132 are slidely disposed in the first space 106, parallel to the bottom plate 102 and vertically connected to the adapter board 110. When the storage 10 is assembled on the rack, the first power supply 132 or the second power supply 132 can be hot-plugged from the backside of the rack.

The dividing boards 150 are disposed in the second space 108 and vertical to the side plates 104, so as to divide the second space 108 into several partitions for receiving the hard disk units (not shown). The storage 10 further comprises a fan module 170 that is slidely disposed in the first space 106, parallel to the bottom plate 102 and vertically connected to the adapter board 110. When the storage 10 is assembled on the rack, the fan module 170 can be hot-plugged from the backside of the rack.

Figure 2:
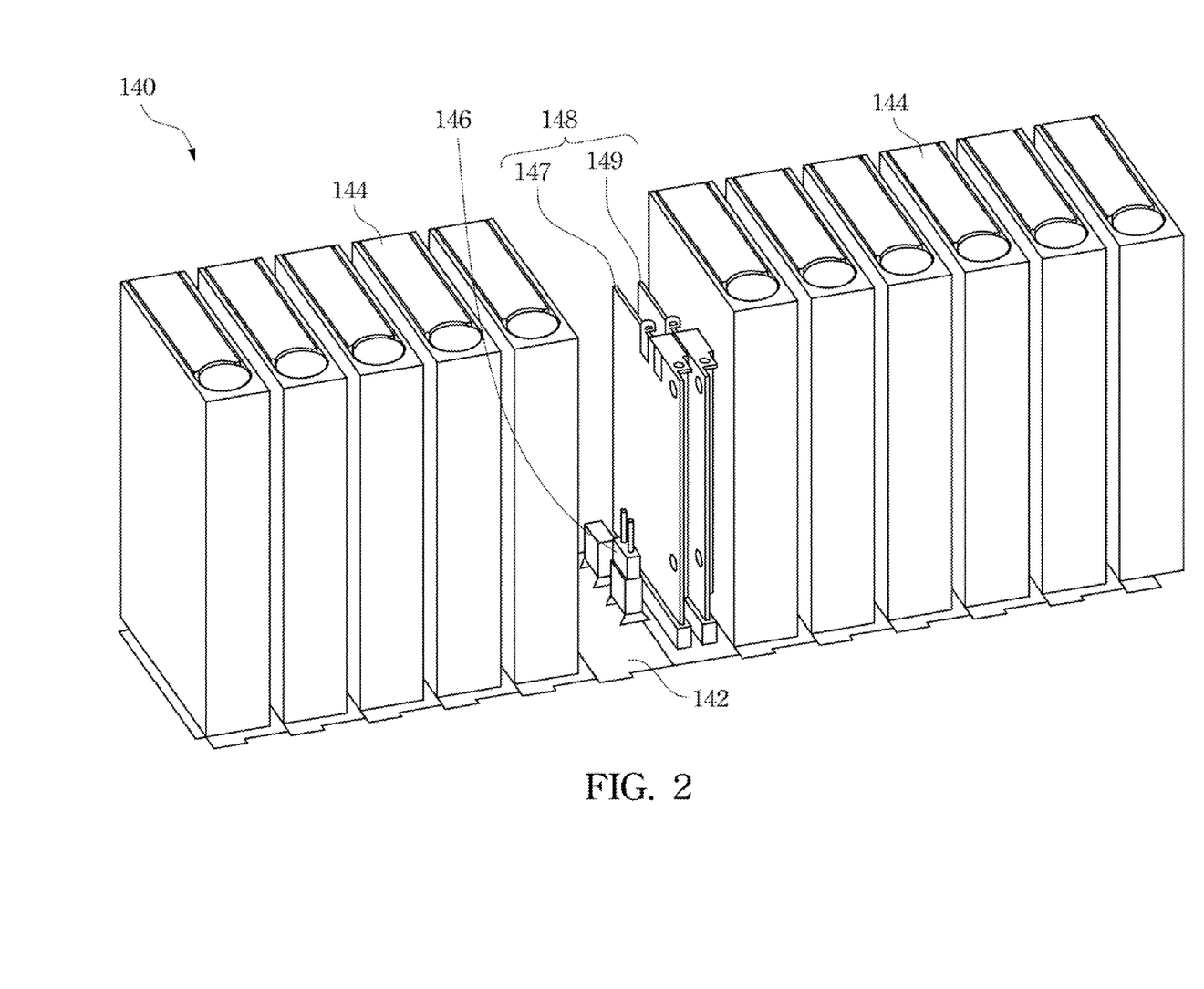
FIG. 2 depicts a stereo diagram of the hard disk units disposed among the dividing boards of FIG. 1A according to an embodiment of the present invention.

Next, reference is made to FIGS. 1A and 2, in which FIG. 2 depicts a stereo diagram of the hard disk units 140 disposed among the dividing boards 150 of FIG. 1A according to an embodiment of the present invention. Each of the hard disk units 140 includes a hard disk back board 142, a plurality of hard discs 144 vertically inserted into the hard disk back board 142, a cable set 146 connecting between the hard disk back board 142 and the adapter board 110, and a hard disk expansion card module 148 disposed on the hard disk back board 142. The hard discs 144 and the hard disk expansion card module 148 are inserted vertically into the hard disk backboard 142. The hard disk expansion card module 148 is disposed on a side of the cable set 146. The cable set 146 comprises power cables and signal cables.

The hard disk expansion card module 148 can expand the hard disk controlling interfaces of the hard disk backboard 142. The hard disk expansion card module 148 comprises a first control board 147 and a second control board 149 redundantly with each other. The first control board 147 and the second control board 149 can control all hard disks 144 of the corresponding the hard disk units 140, respectively. The first control board 122 of FIG. 1A controls the first hard disk expansion card 147, and the second control board 124 controls the second hard disk expansion card 149.

The control board module 120 of the storage 10 controls the hard disk expansion card module 148 of the hard disk units 140, the individual hard disk expansion card module 148 controls the hard disks 144 of the corresponding the hard disk units 140. Hence, the storage 10 can efficiently increase the quantity of the hard disks 144 controlled by the control board module 120 via the hard disk expansion card module 148.

Figure 3:
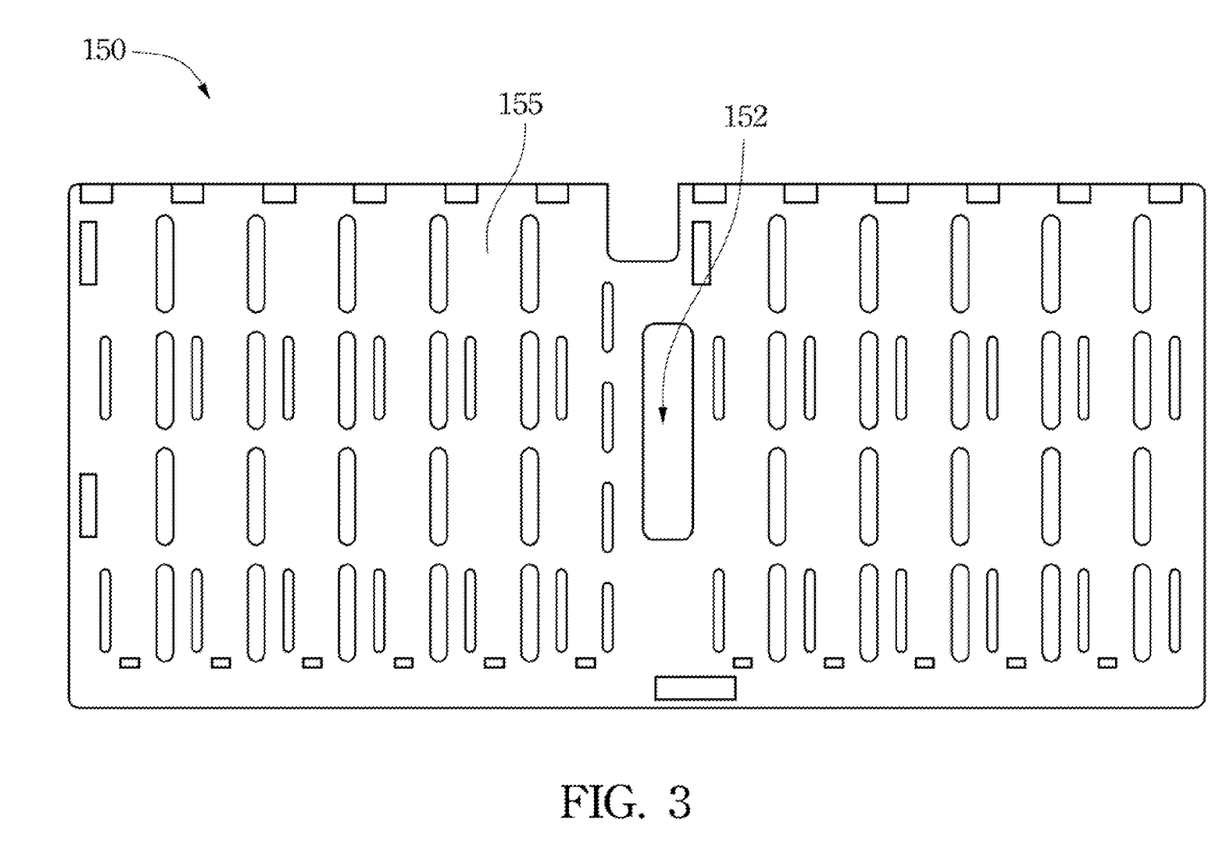
FIG. 3 depicts a stereo diagram of the dividing boards of FIG. 18.

And then, reference is made to FIGS. 1B and 3, in which FIG. 3 depicts a stereo diagram of the dividing boards 150 of FIG. 1B. A plurality of dividing boards 150 are disposed vertically to the side plates 104, for separating the hard disk units 140 in the second space 108 (as shown in FIG. 2). Each of the dividing boards 150 has a guiding pore 152 disposed therein, and the guiding pore 152 is substantially in a center of each dividing board 150. The cable set 146 passes through the guiding pores 152 for connecting the adapter board 110 with the hard disk backboard 142 of the corresponding cable set 146. A plurality of guiding tracks 155 can be disposed between the adjacent two dividing boards 150 and vertical to the bottom plate 102, and the hard disks 144 of FIG. 2 are inserted among the guiding tracks 155.

When the storage 10 is assembled on the rack, if any one hard disk 144 is necessarily hot-plugged, the storage 10 is firstly drawn out from the front side of the rack for exposing the second space 108, and the hard disk 144 is hot-plugged along the direction vertical to the hard disk back board 142. In other words, the hot-plugged direction of the hard disk 144 is vertical to the direction of the storage 10 hot-plugged from the rack. In comparison with the conventional hot-plugged interface of the hard disks disposed in the front panel, the structure disclosed herein can provide more space for configuring the hard disks, and the storage 10 has a storing space much larger than the conventional storage.

The case 100 has a specific width, and each dividing board 150 has a longer span, so that the central region of the dividing boards 150 are easily deformed, resulting in the derailment of the hard disk 144 during hot-plugging the hard disk 144. Accordingly, the dividing boards 150 of the storage 10 can be further strengthened in another embodiment.

Figure 4:
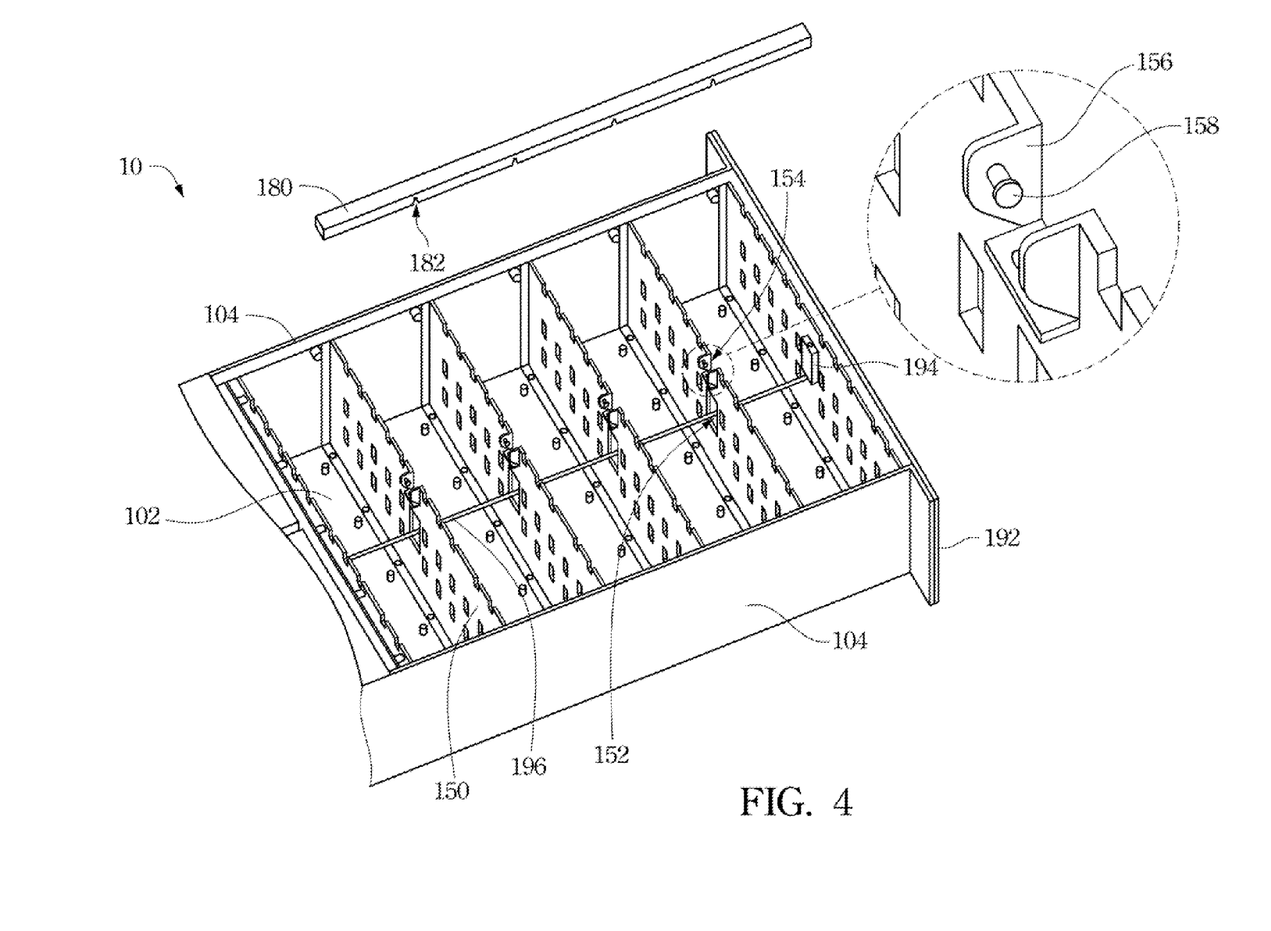
FIG. 4 depicts an explored diagram of the storage according to a second embodiment of the present invention.

Reference is made to FIG. 4, which depicts an explored diagram of the storage 10 according to a second embodiment of the present invention. The storage 10 further comprises a strengthening beam 180. In order to lodge the dividing boards 150 better, the strengthening beams 180 are disposed parallel to the side plates 104 respectively, and the strengthening beam 180 has the same distance substantially apart from the two side plates 104. Each of the dividing boards 150 has a guiding pore 152 is disposed below the strengthening beam 180. Each notch 154 is disposed above each guiding pore 152 of each of the dividing boards 150, and the strengthening beam 180 is lodged in notches 154 of the dividing boards 150.

Two folded edges 156 are respectively disposed on two sides of the notch 154 of the dividing boards 150, and each folded edge 156 has a protrusion 158 disposed thereon. The strengthening beam 180 has a plurality of trenches 182 corresponding to the protrusions 158. The trenches 182 have openings toward the bottom plate 102. The trenches 182 of the strengthening beam 180 are lodged in the corresponding protrusions 158 of the dividing boards 150, so as to fixing the strengthening beam 180 on the dividing boards 150. The strengthening beam 180 lodged on the dividing boards 150 can effectively supplement the structural strength of the central region of the dividing boards 150.

The storage 10 further comprises a front panel 192 and a switch circuit board 194, in which the front panel 192 is disposed on a front end of the second space 108, and the switch circuit board 194 is disposed in an inner side of the front panel 192. The switch circuit board 194 is signally connected to the front panel 192, in which the front panel 192 shows the state of the storage 10 thereon, and the storage 10 is turned on or off by operating the front panel 192. The storage 10 further comprises a power controlling wire 196, and the power controlling wire 196 passes through the guiding pores 152 of the dividing boards 150 and electrically connects between the switch circuit board 194 and the adapter board 110, thereby connecting the switch circuit board 194 with the hard disk back board 142.

Figure 5:
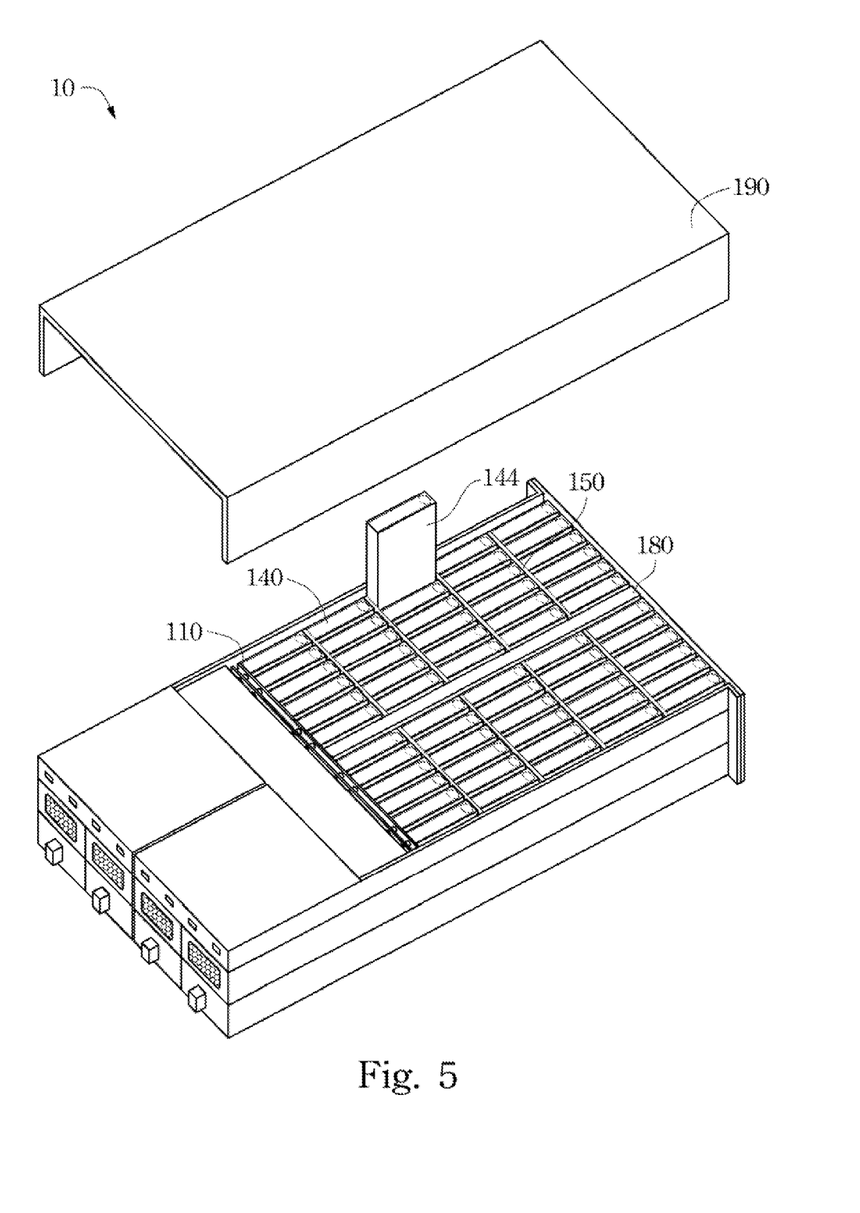
FIG. 5 depicts an explored diagram of the storage according to a third embodiment of the present invention.

Reference is made to FIG. 5, which depicts an explored diagram of the storage 10 according to a third embodiment of the present invention. The hard disk units 140 are among the dividing boards 150, each hard disc 144 is inserted in a hot-plug way into the hard disk backboard 142 (as shown in FIG. 2). The strengthening beam 180 is lodged on the dividing boards 150, the cable set 146 and the hard disk expansion card module 148 (as shown in FIG. 2) are substantially disposed below the dividing boards 150. The cable set 146 passes through the guiding pores 152 of the dividing boards 150 (as shown in FIG. 4) for connecting the adapter board 110 with the corresponding hard disk backboard 142. The storage 10 further comprises a case cover 190 for covering and protecting the second space 108 and the hard disk units 140 disposed therein.

According to the preferred embodiments of the present invention, the aforementioned storage has the hard disk expansion card module beneficially to expand the quantity of the hard disk interfaces controlled by the control board module. In addition, the components like the hard disk expansion card module, the power supply module and the control board module all have the redundant scheme, thereby keeping the storage to operate normally even when any one of the aforementioned components is destroyed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A storage, comprising:
    a case having a bottom plate and two parallel side plates;
    an adapter board disposed between and vertical to the side plates, so as to divide the case into a first space and a second space;
    a control board module disposed in the first space and electrically connected to the adapter board;
    a power supply module disposed in the first space and electrically connected to the adapter board;
    a plurality of hard disk units disposed in the second space, and each of the hard disk units comprises:
        a hard disk backboard disposed on the bottom plate;
        a plurality of hard discs vertically inserted into an upper surface of the hard disk back board;
        a hard disk expansion card module, wherein the hard disk expansion card module is inserted vertically into the upper surface of the corresponding hard disk back board, so as to expand a hard disk interface of the hard disk back board; and
        a cable set connecting between the hard disk backboard and the adapter board;
    a plurality of dividing boards disposed between the side plates, so as to separate the hard disk units, wherein the hard discs are inserted into a plurality of guiding tracks formed between the adjacent two dividing boards and vertical to the bottom plate; and
    a case cover covering the second space and the hard disk units disposed therein.

2. The storage of claim 1, wherein the dividing boards are vertical to the side plates.

3. The storage of claim 1, wherein the control board module comprises a first control board and a second control board, the first control board and the second control board are redundantly with each other.

4. The storage of claim 3, wherein the first control board and the second control board are slidably disposed in the first space, parallel to the bottom plate and vertically connected to the adapter board.

5. The storage of claim 1, wherein each of the hard disk expansion card module comprises a first hard disk expansion card and a second hard disk expansion card redundantly with each other, the first control board controls the first hard disk expansion card, and the second control board controls the second hard disk expansion card.

6. The storage of claim 5, wherein the hard disk expansion card module is disposed on a side of the cable set.

7. The storage of claim 1, further comprising:
    a fan module slidably disposed in the first space, parallel to the bottom plate and vertically connected to the adapter board.

8. The storage of claim 1, wherein the power supply module comprises a first power supply and a second power supply redundantly with each other.

9. The storage of claim 8, wherein the first power supply and the second power supply are slidably disposed in the first space, parallel to the bottom plate and vertically connected to the adapter board.

10. The storage of claim 1, wherein each of the dividing boards has a guiding pore disposed therein, the cable set of each of the hard disk units passes through the guiding pore for connecting the adapter board with the corresponding hard disk back board.

11. The storage of claim 10, further comprising:
    at least a strengthening beam, wherein the strengthening beam is disposed parallel to the side plates and lodged in each notch above each guiding pore of each of the dividing boards.

12. The storage of claim 11, wherein the strengthening beam has the same distance substantially apart from the two side plates.

13. The storage of claim 11, wherein each folded edge on two sides of the notch of each of the dividing boards has a protrusion disposed thereon, and a plurality of trenches of the strengthening beam have openings toward the bottom plate and lodged in the corresponding protrusions.

14. The storage of claim 11, further comprising:
a front panel disposed on a front end of the second space;
a switch circuit board disposed in an inner side of the front panel; and
a power controlling wire passing through the guiding pores of the dividing boards and electrically connecting between the switch circuit board and the adapter board.

* * * * *